(12) United States Patent
Shimomura et al.

(10) Patent No.: US 7,176,042 B2
(45) Date of Patent: *Feb. 13, 2007

(54) LASER BEAM IRRADIATION METHOD THAT INCLUDES DETERMINING A THICKNESS OF SEMICONDUCTOR PRIOR TO CRYSTALLIZING

(75) Inventors: Akihisa Shimomura, Atsugi (JP); Kenji Kasahara, Tsukuba (JP); Aiko Shiga, Shibuya (JP); Hidekazu Miyairi, Tochigi (JP); Koichiro Tanaka, Atsugi (JP); Koji Dairiki, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/883,767

(22) Filed: Jul. 6, 2004

(65) Prior Publication Data

US 2004/0248347 A1 Dec. 9, 2004

Related U.S. Application Data

(62) Division of application No. 10/324,051, filed on Dec. 20, 2002, now Pat. No. 6,767,799.

(30) Foreign Application Priority Data

Dec. 28, 2001 (JP) .............................. 2001-401826

(51) Int. Cl.
*H01L 21/66* (2006.01)

(52) U.S. Cl. ........................ 438/14; 438/487; 438/795; 257/E21.53

(58) Field of Classification Search .................. 438/16, 438/149–151, 166, 150, 308, 378, 486–488, 438/764, 795, 949, 14, 482; 257/E21.53
See application file for complete search history.

(56) References Cited

U.S. PATENT DOCUMENTS

| | | | |
|---|---|---|---|
| 5,529,951 A | 6/1996 | Noguchi et al. | |
| 5,612,251 A | 3/1997 | Lee | |
| 5,851,842 A * | 12/1998 | Katsumata et al. | ............. 438/9 |
| 6,066,516 A * | 5/2000 | Miyasaka | .................... 438/149 |
| 6,271,062 B1 * | 8/2001 | Nakata et al. | .............. 438/151 |
| 6,455,359 B1 | 9/2002 | Yamazaki et al. | |
| 6,455,360 B1 * | 9/2002 | Miyasaka | .................... 438/166 |
| 6,537,864 B1 | 3/2003 | Aya et al. | |
| 6,573,161 B1 | 6/2003 | Miyasaka et al. | |

(Continued)

*Primary Examiner*—Michael Lebentritt
*Assistant Examiner*—Stanetta Isaac
(74) *Attorney, Agent, or Firm*—Eric J. Robinson; Robinson Intellectual Property Law Office, P.C.

(57) ABSTRACT

A laser beam irradiation method that achieves uniform crystallization, even if a film thickness of an a-Si film or the like fluctuates, is provided. The present invention provides a laser beam irradiation method in which a non-single crystal semiconductor film is formed on a substrate having an insulating surface and a laser beam having a wavelength longer than 350 nm is irradiated to the non-single crystal semiconductor film, thus crystallizing the non-single crystal silicon film. The non-single crystal semiconductor film has a film thickness distribution within the surface of the substrate, and a differential coefficient of a laser beam absorptivity with respect to the film thickness of the non-single crystal semiconductor film is positive.

64 Claims, 4 Drawing Sheets

U.S. PATENT DOCUMENTS

| | | |
|---|---|---|
| 6,577,386 B2 | 6/2003 | Yoshida et al. |
| 6,602,765 B2 * | 8/2003 | Jiroku et al. ................. 438/487 |
| 6,645,045 B2 * | 11/2003 | Ohkawa ......................... 451/6 |
| 6,746,903 B2 * | 6/2004 | Miyasaka .................... 438/149 |
| 2002/0004292 A1 | 1/2002 | Yamazaki et al. |
| 2003/0013237 A1 | 1/2003 | Jang et al. |
| 2003/0045074 A1 | 3/2003 | Seibel et al. |
| 2003/0068836 A1 | 4/2003 | Hongo et al. |
| 2003/0094585 A1 | 5/2003 | Hara et al. |
| 2003/0104682 A1 | 6/2003 | Hara et al. |

* cited by examiner (A: absorptivity, t: a-Si film thickness)
※ hatched areas indicate dA/dt>0 regions (A: absorptivity, t: a-Si film thickness)
※ hatched areas indicate dA/dt>0 regions (A: absorptivity, t: poly-Si film thickness)
※ hatched areas indicate dA/dt>0 regions (A: absorptivity, t: poly-Si film thickness)
※ hatched areas indicate dA/dt>0 regions

LASER BEAM IRRADIATION METHOD THAT INCLUDES DETERMINING A THICKNESS OF SEMICONDUCTOR PRIOR TO CRYSTALLIZING

BACKGROUND OF THE INVENTION

1. Field of the Invention

The present invention relates to a method of irradiating a laser beam, and in particular, to a method of irradiating a laser beam that is used in forming an active layer of a thin film transistor or the like.

2. Description of the Related Art

Techniques of crystallizing a semiconductor film formed on an insulating substrate such as glass and techniques of increasing crystallinity thereof by using laser annealing have been researched widely in recent years. As a material for the semiconductor film, silicon (Si) is used in many cases. A technique of crystallizing a semiconductor film by using a laser beam, thus obtaining a crystalline semiconductor film, and a method of irradiating a laser beam to a semiconductor film, thus increasing crystallinity, are referred to as "laser crystallization" within this specification. Further, films that undergo laser irradiation during laser crystallization are referred to as "irradiation films".

Compared to synthetic quartz glass substrates, which are often used conventionally, glass substrates have the advantages of low cost, good workability, and the ease with which large area substrates can be made. This is the reason that the aforementioned research is being carried out. Further, the reason that lasers are preferably used in crystallization is that the glass substrate melting point is low, and it is necessary to reduce the processing temperature to a temperature equal to or less than 600° C. Lasers can impart high energy only to a semiconductor film without causing the substrate temperature to increase very much. Further, a throughput is considerably high compared to a heating means that uses an electric heating furnace.

Crystalline semiconductor films formed by laser beam irradiation have high mobility, and therefore thin film transistors (TFTs) are formed using the crystalline semiconductor films. For example, the crystalline semiconductor films are utilized in an active matrix liquid crystal display device, or the like, in which TFTs used in a pixel portion, or TFTs used in the pixel portion and a driver circuit, are formed on one glass substrate.

A method of using a pulse oscillation laser (pulse laser) and a method of using a continuous wave laser (CW laser) exist as laser light sources used in laser crystallization. Excimer lasers such as XeCl lasers, and higher harmonics of solid lasers such as Nd:YAG lasers, Nd:YVO$_4$ lasers, and Nd:YLF lasers may be used as laser light sources for the former method, and gas lasers such as Ar lasers, and higher harmonics of solid CW lasers such as Nd:YAG lasers and Nd:YVO$_4$ lasers may be used as laser light sources for the latter method.

Amorphous silicon films (a-Si) and polysilicon films (poly-Si) are semiconductor films that can undergo laser crystallization, and the crystallinity of these non-single crystal semiconductor films is increased by performing laser crystallization.

However, if an a-Si film is formed by plasma CVD on a large area substrate, there is a problem in that the film thickness of the formed a-Si film varies according to location within the substrate surface due to the plasma distribution during film formation, the reaction gas outflow distribution, the temperature distribution of heated substrate, and the like, and a film thickness distribution thus develops. Further, if a poly-Si film is formed from a-Si, film thickness variations that occur during film formation of the a-Si film still remain.

For example, if an a-Si film is formed on a 600 mm×720 mm glass substrate by using plasma CVD, variations of ±5% of the a-Si film thickness develop within the substrate surface.

If a state exists in which the film thickness of the non-single crystal semiconductor film has dispersions depending on locations within the substrate surface, the energy necessary for crystallization in locations at which the film thickness has increased becomes relatively larger, and the energy necessary for crystallization in locations at which the film thickness has decreased becomes relatively smaller.

It is extremely difficult to control laser beam energy by the size of the film in thickness, and therefore only a fixed energy can be imparted to the irradiation film if laser crystallization is performed by using, for example, a pulse laser such as an excimer laser. The degree of crystallization thus differs depending on location within the substrate surface, and the grain size of the polycrystalline semiconductor film obtained becomes non-uniform in locations within the substrate surface. A problem therefore exists in that variations develop in the characteristics of TFTs formed on a large area substrate.

On the other hand, solid pulse lasers and solid CW lasers using solid laser media (hereinafter both are referred to together as solid lasers) are maintenance-free, have stable output, and are superior to excimer lasers in mass production because it is possible to have higher repetitive oscillation when using a solid laser as a pulse laser than when using an excimer laser.

A technique of laser crystallization for forming a polycrystalline silicon film having a large grain size of several tens of micrometers on a glass substrate by using a CW Nd:YVO$_4$ laser with LD excitation has been developed recently. It is possible to manufacture TFTs having electron mobility equal to or greater than 600 cm$^2$/Vs by using this technique. Forming an LSI containing a CPU on a glass substrate, to produce a "sheet computer", is moving closer and closer to realization.

However, there are not many types of solid lasers at present, and almost all available solid lasers have an oscillation wavelength (fundamental wave) in the red color region or the infrared region. Semiconductor films absorb almost no light in the red color region or the infrared region, and therefore the second harmonic (2ω), the third harmonic (3ω), or a higher harmonic corresponding to a wavelength in the range of the visible light region to the ultraviolet light region is used when a solid laser is utilized during laser crystallization. However, the energy conversion efficiency with respect to the fundamental wave is highest with the second harmonic, and therefore it is advantageous from the perspective of an energy to use the second harmonic.

The wavelength of the second harmonic of a solid laser is mainly in the visible light region on the long wavelength side greater than 350 nm. The wavelengths of the second harmonic of typical solid lasers are shown as follows: Nd:YAG laser: 532 nm; Nd:YVO$_4$ laser: 532 nm; Nd:YLF laser: 527 nm (or 524 nm); Ti:sapphire laser: 345 to 550 nm (variable wavelength); and Alexandrite laser: 350 to 410 nm (variable wavelength).

The skin depth to the semiconductor film is deep when using the second harmonic of a solid laser for laser crystallization compared to an excimer laser beam or the like having a wavelength in the ultraviolet light region, and therefore repetitive reflection develops within the semiconductor thin film, and there is interference between the reflected beam and the incident beam. The optical characteristics of the laser beam with respect to the irradiation film (reflectivity, transmissivity, and absorptivity) periodically fluctuate due to the film thickness of the semiconductor film due to the effect of the interference.

Refer to FIGS. 1A and 1B. FIG. 1A is a diagram showing absorption spectra of a-Si films formed on a glass substrate. Reference numeral 101 denotes an adsorption spectrum when the a-Si film thickness is 30 nm, reference numeral 102 denotes an adsorption spectrum when the a-Si film thickness is 50 nm, reference numeral 103 denotes an adsorption spectrum when the a-Si film thickness is 70 nm, reference numeral 104 denotes an adsorption spectrum when the a-Si film thickness is 90 nm, and reference numeral 105 denotes an adsorption spectrum when the a-Si film thickness is 110 nm. Further, FIG. 1B is a diagram showing absorption spectra of poly-Si films formed on a glass substrate. Reference numeral 111 denotes an adsorption spectrum when the poly-Si film thickness is 30 nm, reference numeral 112 denotes an adsorption spectrum when the poly-Si film thickness is 50 nm, reference numeral 113 denotes an adsorption spectrum when the poly-Si film thickness is 70 nm, reference numeral 114 denotes an adsorption spectrum when the poly-Si film thickness is 90 nm, and reference numeral 115 denotes an adsorption spectrum when the poly-Si film thickness is 110 nm.

It can be seen that the light absorption spectra are dependent upon the irradiation film thickness in the visible light region, on the long wavelength side greater than 350 nm. If laser crystallization is performed using a laser beam that possesses a wavelength in this wavelength region, then the energy imparted to the semiconductor film varies due to the film thickness of the semiconductor film itself, even if the laser beam energy is fixed.

Refer to FIGS. 2A and 2B. FIG. 2A is a diagram showing a film thickness dependence for light absorptivity by an a-Si film at a wavelength of 308 nm (reference numeral 201), and a film thickness dependence for light absorptivity by an a-Si film at a wavelength of 532 nm (reference numeral 202). FIG. 2B is a diagram showing a film thickness dependence for light absorptivity by a poly-Si film at a wavelength of 308 nm (reference numeral 211), and a film thickness dependence for light absorptivity by a poly-Si film at a wavelength of 532 nm (reference numeral 212).

As can be understood from FIGS. 2A and 2B, the skin depth to the semiconductor film is shallow in laser crystallization methods that use excimer lasers, such as an XeCl laser, because the laser beam wavelength is in the ultraviolet light region. Therefore there is no dependence of the light absorptivity on the irradiation film thickness, and there are no fluctuations of the energy imparted to the semiconductor film by laser irradiation due to the film thickness of the semiconductor film itself. On the other hand, if the film thickness of the a-Si film or the like fluctuates in laser crystallization methods that use the second harmonic of a solid laser, then the light absorptivity corresponding to the fluctuations is attenuated periodically and exponentially, and the energy imparted to the semiconductor film also fluctuates in a similar manner. It is therefore difficult to achieve uniform crystallization.

Laser crystallization methods that use the second harmonic of a conventional solid laser have been found to have more disadvantages in this point than laser crystallization methods that use an excimer laser beam.

The inventors of the present invention noticed that the dependence of the light absorptivity on the film thickness that can be seen for the second harmonic of a solid laser is rather effective against the problem of variations in crystallinity within the substrate surface caused by variations in the film thickness of the irradiation film within the substrate surface. In other words, by limiting the film thickness of the irradiation film, the energy absorbed becomes relatively larger at locations within the substrate surface when the film thickness of the irradiation film increases, and the energy absorbed becomes relatively smaller at locations within the substrate surface when the film thickness of the irradiation film decreases in laser crystallization using the second harmonic of a solid laser, and it is considered that crystallization can proceed to the same degree. It is thus expected that variations in the TFT characteristics within the substrate surface can be reduced.

SUMMARY OF THE INVENTION

An object of the present invention is to provide a laser beam irradiation method, and a method of manufacturing a thin film transistor, which are capable of reducing non-uniformity in the degree of crystallization of a polycrystalline semiconductor film formed by using laser crystallization, and reducing variations in TFT characteristics, caused by variations in the film thickness of a non-single crystal semiconductor film within a surface of a large area substrate having an insulating surface when manufacturing the TFTs on the substrate.

After conducting extensive studies on how to resolve the aforementioned problem, and also considering experimental results, the inventors of the present invention have finally completed this invention. In order to solve the aforementioned problem, a non-single crystal semiconductor film, formed having a specific target film thickness, undergoes laser crystallization using a laser beam having a long wavelength greater than 350 nm in the method of manufacturing a semiconductor device of the present invention.

According to the present invention, there is provided a laser beam irradiation method, comprising:

forming a non-single crystal semiconductor film over a substrate having an insulating surface; and irradiating a laser beam having a wavelength greater than 350 nm to the non-single crystal semiconductor film to crystallize the non-single crystal semiconductor film, wherein:

the non-single crystal semiconductor film has a film thickness distribution within its surface; and a differential coefficient of an absorptivity of the laser beam with respect to the film thickness of the non-single crystal semiconductor film is positive.

The laser beam irradiation method according to the present invention comprises:

forming a non-single crystal semiconductor film on a substrate having an insulating surface; and irradiating a laser beam having a wavelength greater than 350 nm to the non-single crystal semiconductor film to crystallize the non-single crystal semiconductor film, wherein:

the non-single crystal semiconductor film has a film thickness distribution within its surface; and the film thickness of the non-single crystal semiconductor film during irradiation of the laser beam is determined by a refractive index of the wavelength of the laser beam.

Also, according to the present invention, there is provided a method of manufacturing a thin film transistor, comprising:

forming a non-single crystal semiconductor film on a substrate having an insulating surface; and irradiating a laser beam having a wavelength greater than 350 nm to the non-single crystal semiconductor film to crystallize the non-single crystal semiconductor film, wherein:

the non-single crystal semiconductor film has a film thickness distribution within its surface; and a differential coefficient of an absorptivity of the laser beam with respect to the film thickness of the non-single crystal semiconductor film is positive.

The method of manufacturing a thin film transistor according to the present invention, comprises:

forming a non-single crystal semiconductor film on a substrate having an insulating surface; and irradiating a laser beam having a wavelength greater than 350 nm to the non-single crystal semiconductor film to crystallize the non-single crystal semiconductor film, wherein:

the non-single crystal semiconductor film has a film thickness distribution within its surface; and a center film thickness of the non-single crystal semiconductor film in the laser beam irradiation is determined by a refractive index of the wavelength of the laser beam.

DETAILED DESCRIPTION OF THE PREFERRED EMBODIMENTS

A laser crystallization method is discussed in which the film thickness of an irradiation film is set before laser crystallization so that variations in the degree of crystallization within a substrate surface after performing laser crystallization are reduced for cases of performing laser crystallization over the entire substrate surface by using the second harmonic (532 nm) of a CW Nd:YVO$_4$ laser to crystallize an amorphous silicon (a-Si) film formed on a glass substrate having an insulating film. Variations in the film thickness of the a-Si film depending on locations within the substrate surface, and a dependence on the a-Si film thickness of the absorptivity of 532 nm light, are investigated in advance, before film formation processing of the a-Si film.

The irradiation film is taken as an a-Si film formed by plasma chemical vapor deposition (CVD). Further, the absorptivity of 532 nm light by an a-Si film substrate is taken as A(t) in this embodiment mode, where the a-Si film thickness is t.

First, variations in film thickness of the a-Si film formed by plasma CVD are investigated, along with the dependence of 532 nm light absorptivity on the a-Si film thickness.

An a-Si film may be formed on a dummy substrate having the same size as the actual substrate, for example, in investigating the variations in the film thickness of the a-Si film, and the film thickness within substrate surface of the dummy substrate may be measured at several points by using a spectral ellipsometer.

Film thickness variations of approximately ±5% develop within the substrate surface when an a-Si film is formed on a 600 mm×720 mm substrate by using plasma CVD, for example. Thus, if the target film thickness when forming the a-Si film is taken as t, film thickness variations develop within the substrate surface with a maximum film thickness equal to 1.05 t, and a minimum film thickness equal to 0.95 t.

In order to investigate the a-Si film thickness dependence on the absorptivity of 532 nm light, actual measurements of the absorption spectrum may be made by using a spectral photometer, for example, on substrates on which an a-Si film is formed in advance, and the film thickness of the a-Si film is to be clarified. Data showing the dependence of 532 nm light absorptivity upon a-Si film thickness can be obtained, provided that absorption spectrum measurements are made under several a-Si film thickness conditions.

Alternatively, the index of refraction of an a-Si film at 532 nm may be found by using a spectral ellipsometer or the like, and the light absorptivity A(t) may be found by running a computer simulation. Computer simulations are useful in finding a continuous light absorptivity dependence on the film thickness, without requiring a lot of effort.

Figure 1A:
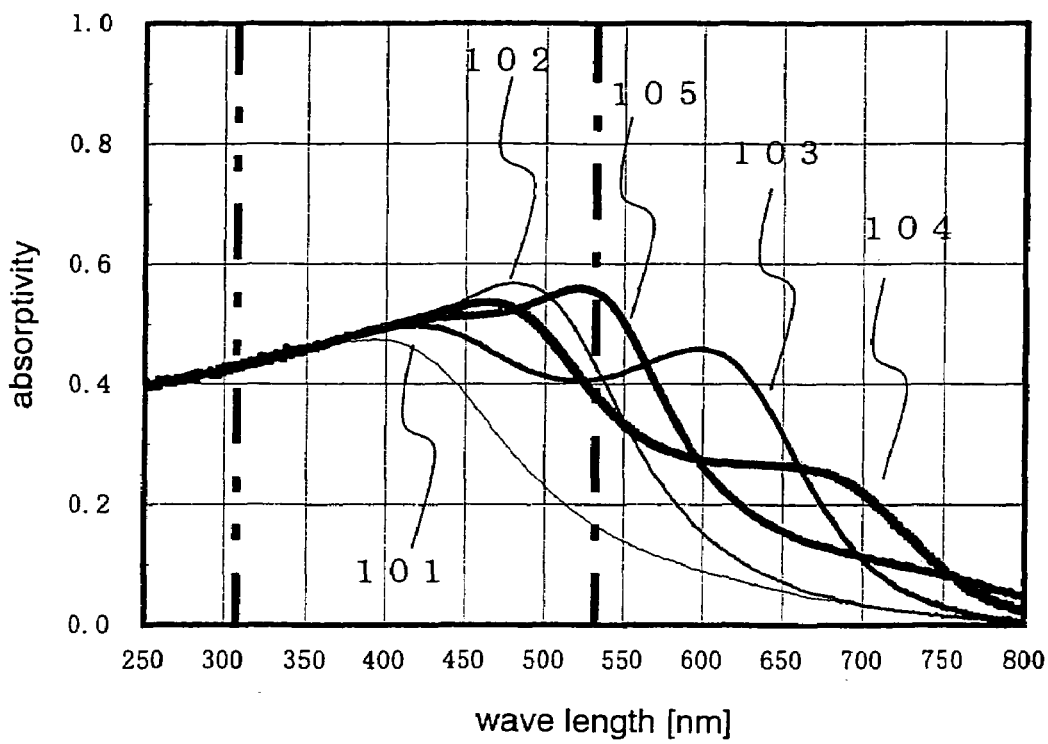
FIGS. 1A and 1B show absorption spectra with respect to a wavelength of a laser beam irradiated onto a-Si films and poly-Si films formed on a glass substrate.
Figure 1B:
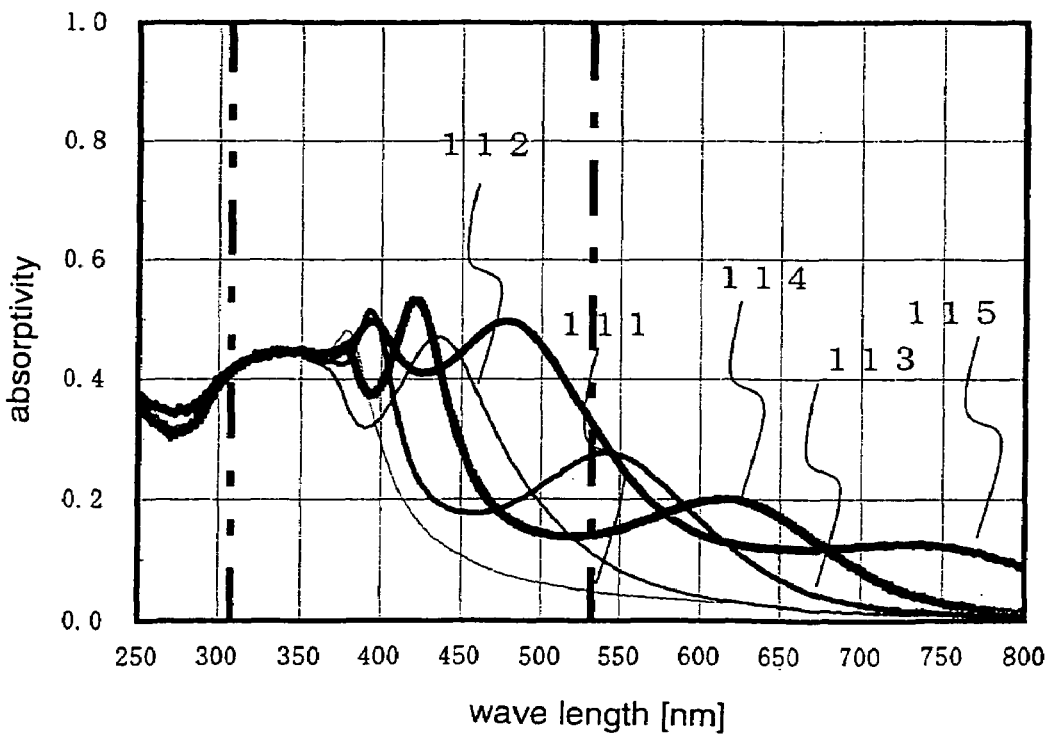
Figure 2A:
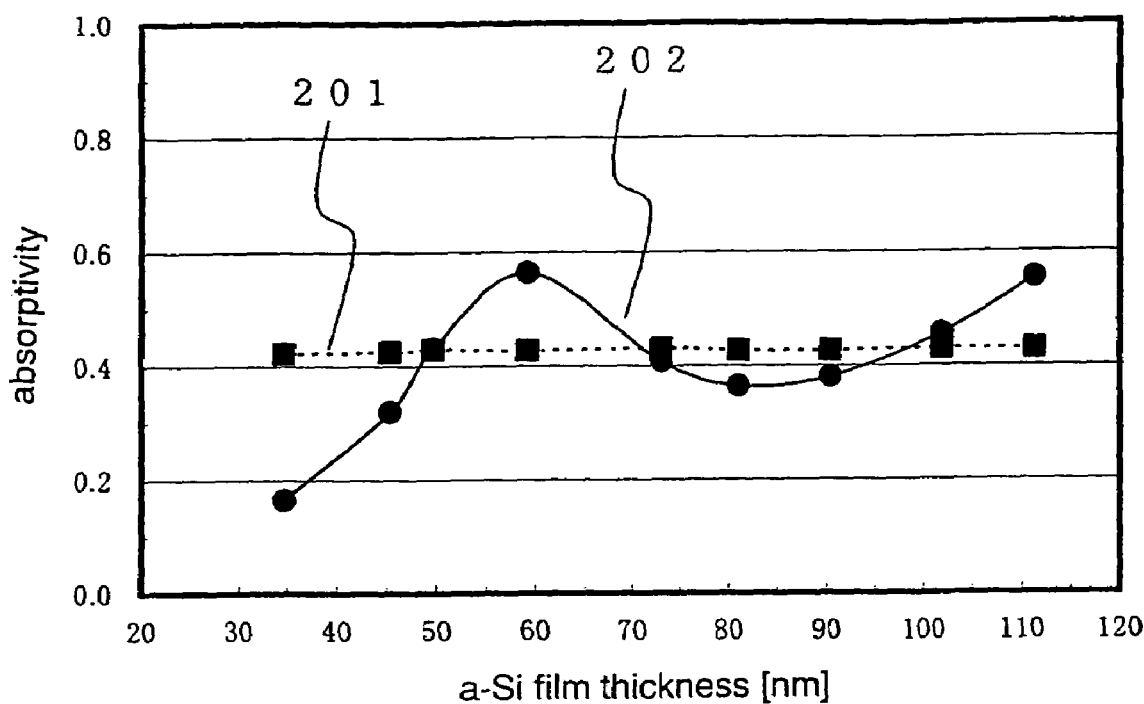
FIGS. 2A and 2B show a film thickness dependence for light absorptivity by an a-Si film at a wavelength of 308 nm (reference numeral 201), and a film thickness dependence for light absorptivity by an a-Si film at a wavelength of 532 nm (reference numeral 202); and a film thickness dependence for light absorptivity by a poly-Si film at a wavelength of 308 nm (reference numeral 211), and a film thickness dependence for light absorptivity by a poly-Si film at a wavelength of 532 nm, respectively (reference numeral 212)
Figure 2B:
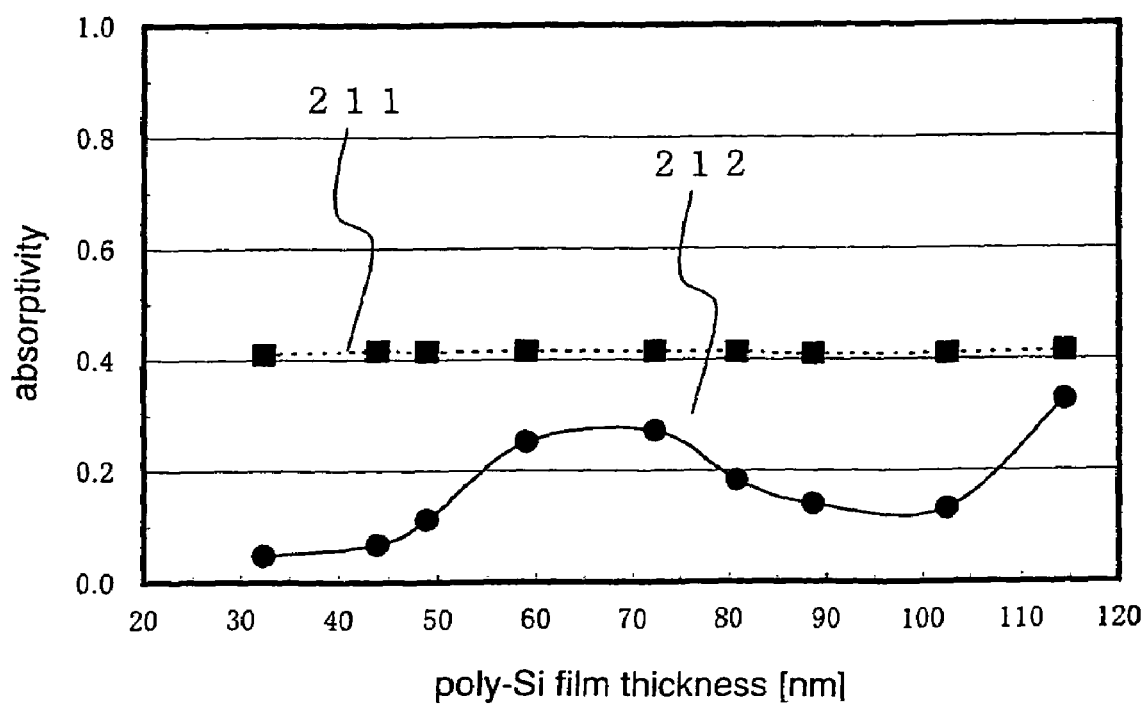
Figure 3A:
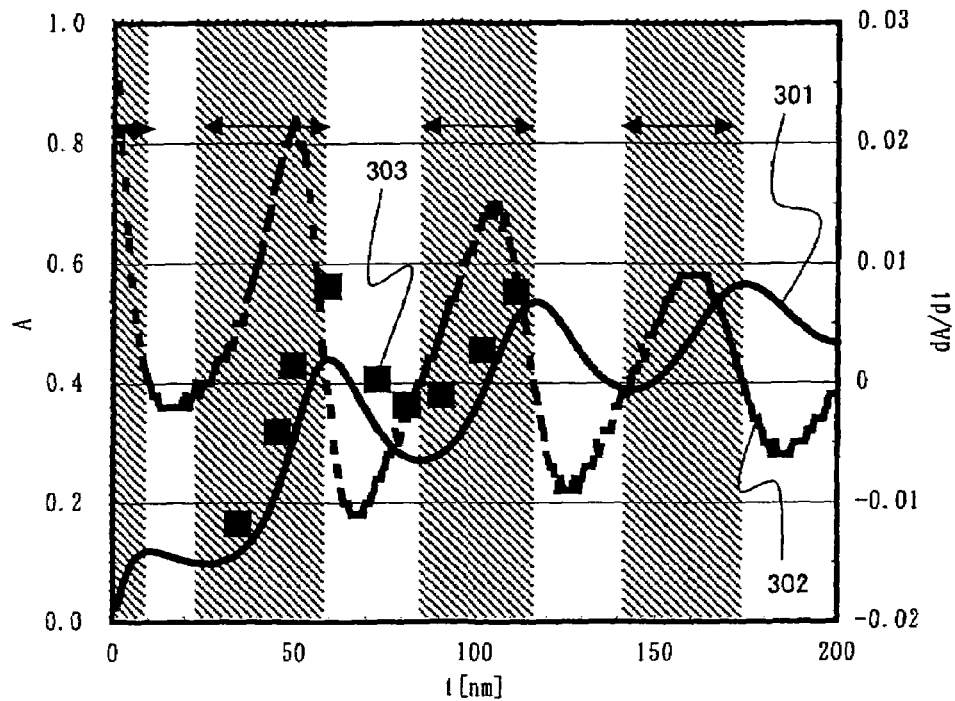
FIGS. 3A and 3B show: an absorptivity, A(t), of light (532 nm) in an a-Si film found by computer simulation performed based on an index of refractive index (n) and an extinction constant (k) obtained from an ellipsometer; a derivative dA(t)/dt of the light absorptivity A(t); and actual measured values of the absorptivity of light having a wavelength of 532 nm when the a-Si film thickness is changed.
Figure 3B:
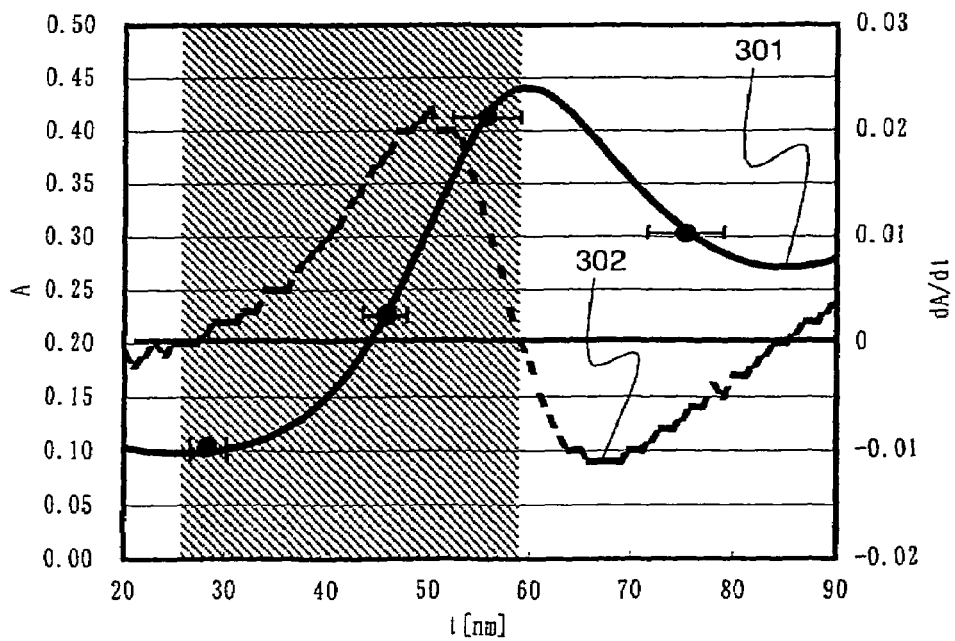

Refer here to FIGS. 3A and 3B. Reference numeral 301 in FIG. 3A shows the 532 nm light absorptivity A(t) found by a computer simulation performed based on an index of refractive index (n) and an extinction constant (k) obtained from a spectral ellipsometer. Reference numeral 302 denotes a derivative dA(t)/dt of the light absorptivity A(t) denoted by 301, and reference numeral 303 denotes actual measured values of the 532 nm light absorptivity taken while varying the a-Si film thickness. Note that, for convenience of computation, the difference among the variations in the light absorptivity with respect to the film thickness may be found as a substitute for the derivative of the light absorptivity A(t).

By comparing the actual measured values 303 with the simulation 301, it can be seen that, although there is a small difference with the values of the derivative of the light absorptivity A(t), the values of the a-Si film thickness that denote the maximum value and the minimum value of the 532 nm light absorptivity have relatively good agreement.

If the derivative of the light absorptivity is found from the simulation results of the light absorptivity at 532 nm by the a-Si film, and a-Si film thickness ranges in which $dA(t)/dt>0$ are selected, then a range from 28 nm to 58 nm, a range from 86 nm to 115 nm, a range from 144 nm to 173 nm, and the like are found. Variations in the degree of crystallization due to film thickness variations can be reduced in a self-alignment manner, provided that the film thickness of the a-Si film is within these ranges. This can be clearly understood by referring to FIG. 3B in which the graph of a region from 20 nm to 90 nm of FIG. 3A is blown up.

The a-Si film formed on the glass substrate at a target film thickness of t possesses film thickness variations within the substrate surface, with the maximum film thickness equal to 1.05 t and the minimum film thickness equal to 0.95 t. Therefore the film thickness t may be selected so that $dA(t)/dt>0$ is always true, even if the film thickness fluctuates from 0.95 t to 1.05 t, in order to reduce variations in the degree of crystallization, due to film thickness variations over the entire substrate surface, in a self-alignment manner.

Further, $dA(t)/dt>0$ expresses mathematically a state in which $A(t)$ increases monotonically from the minimum value to the maximum value. The periodicity of the values of t showing maximum values and minimum values of $A(t)$ may therefore be found in order to obtain a range for t at which variations in the degree of crystallization due to film thickness variations are reduced in a self-alignment manner. A method therefor is explained below.

A light intensity distribution $I(z)$ in a depth direction (z direction) of the semiconductor film for cases in which the semiconductor film is irradiated by laser light follows Lanbert's Law, expressed by $I(z)=I(0)\cdot(1-R)\cdot\exp(-\alpha z)$, where $I(O)$ denotes irradiation light intensity, R denotes light reflectivity, and $\alpha$ denotes a light absorptivity coefficient.

The light absorptivity of a semiconductor film with respect to laser light having a longer wavelength than 350 nm is attenuated periodically and exponentially in accordance with film thickness. The $(1-R)$ term within respective $I(z)$ terms described above contributes to periodic fluctuations, and the $\exp(-\alpha z)$ term contributes to exponential attenuation. Periodic fluctuation in the light reflectivity R becomes a cause of periodic fluctuations in $A(t)$ as shown directly in FIGS. 2A and 2B, FIGS. 3A and 3B, and FIGS. 4A and 4B, and the a-Si film thickness showing maximum and minimum values of light absorptivity can easily be found by computing the minimum and maximum values of reflectivity.

If the reflectivity $R(t)$ is considered for a case in which light is made incident from a medium 0 (index of refraction n0) on a parallel plane film (corresponding to the semiconductor film, film thickness t, index of refraction n1) on a substrate (index of refraction n2), then values of t at which $R(t)$ is a maximum value or a minimum value are determined by the magnitude of relationship between n0, n1, and n2.

If laser wavelength is expressed by $\lambda$, and m is taken as a natural number, then for a case (A) in which $n2>n1>n0$, or $n2<n1<n0$, there is no phase shift at the two film interfaces, and therefore an increasing reflectivity condition exists. $R(t)$ takes on a minimum value when $n1\times t=(2m+1)\times\lambda/4$, and takes on a maximum value when $n1\times t=2m\times\lambda/4$. For a case (B) in which $n2>n1<n0$, or $n2<n1>n0$, there is a phase shift at the two film interfaces. $R(t)$ therefore takes on opposite values: a maximum value when $n1\times t=(2m+1)\times\lambda/4$, and a minimum value when $n1\times t=2m\times\lambda/4$.

The relationship between the indexes of refraction n2, n1, and n0 normally satisfies the case (B) above for semiconductor films formed on glass substrates. For example, in the case of a single layer a-Si film, the index of refraction n2 of the glass substrate in the visible light region (300 nm to 800 nm) is approximately 1.5, and the index of refraction ni1 of the a-Si film is equal to or greater than 3.5 at a wavelength region equal to or greater than 350 nm. A single layer film is used, and therefore n0=1 (air).

The film thickness dependence of the light absorptivity fluctuates periodically in accordance with $(1-R)$, and therefore $A(t)$ takes on a minimum value when $n1\times t=(2m-1)\times\lambda/4$, and $A(t)$ takes on a maximum value when $n1\times t=2m\times\lambda/4$. A range of t at which $dA(t)/dt>0$ can thus be expressed by the following equation, using the laser wavelength $\lambda$ and the index of refraction of the semiconductor film n1:

$(2m-1)\lambda/4n1<t<2m\lambda/4n1$ (where $m=1, 2, 3, \ldots$)

It can thus be seen from the above method that the ranges of the target film thickness of an a-Si film capable of reducing variations in the degree of crystallization, due to variations in the film thickness over the entire substrate surface are from 29.5 nm to 55.2 nm, from 90.5 nm to 109.5 nm, from 151.6 nm to 164.8 nm, and the like. Variations in the degree of crystallization caused by variations in the film thickness within the substrate surface can be reduced provided that laser crystallization of the entire substrate surface is performed by using the second harmonic (532 nm) of a CW Nd:YVO$_4$ laser with the film thickness of the a-Si film set to one of the above ranges for the laser irradiation process.

Once the set film thickness of the a-Si film is determined, the a-Si film may then be formed with the determined film thickness on the glass substrate if laser crystallization of the a-Si film substrate is to be performed by using the second harmonic (532 nm) of a CW Nd:YVO$_4$ laser.

Further, even if the set film thickness is not achieved during formation of the a-Si film, additional film formation or film reduction by etching may be conducted to achieve the set film thickness for the laser irradiation process.

For cases in which crystallization over the entire substrate surface is not necessary, and for cases in which it is not necessary to reduce variations in the degree of crystallization over the entire substrate surface, the range to which the film thickness is measured may be limited to portions of the substrate where it is desired to reduce variations in the degree of crystallization.

Embodiments

Embodiment 1

A method of manufacturing a TFT in which variation in the TFT characteristics within the surface of a substrate are reduced is discussed as Embodiment 1. For cases in which a continuous grain silicon (poly-Si) film, formed on a glass substrate having an insulating film, is crystallized over the entire surface of the substrate by using the second harmonic (532 nm) of a pulse Nd:YAG laser, variations in the film thickness of the poly-Si film depending on locations within the substrate surface, and the poly-Si film thickness dependence of the absorptivity of 532 nm light are investigated in advance, before laser crystallization processing. The film thickness of the irradiation film is set so that variations in the degree of crystallization within the substrate surface after performing laser crystallization therein are reduced and thereafter, laser crystallization is performed.

In Embodiment 1, the irradiation film is taken as poly-Si film obtained by solid phase crystallization (SPC) of a-Si film formed by plasma chemical vapor deposition (CVD). Further, the absorptivity of 532 nm light by the poly-Si film substrate is taken as A(t) within Embodiment 1, where t denotes the poly-Si film thickness.

Variations in the film thickness of the poly-Si film, and the dependence of the absorptivity of 532 nm light on the poly-Si film thickness are investigated before forming the a-Si film. Film formation of an a-Si film on a dummy substrate having the same size as the actual substrate may be performed, for example, and the film thickness may be measured at many points within the surface of the dummy substrate by using an ellipsometer in order to investigate film thickness variations. Although an SPC method is used in making the a-Si film into a poly-Si film, the film thickness does not vary during phase changes from the a-Si film to the poly-Si film, and therefore the film thickness data measured at many points within the substrate surface may also be treated as poly-Si film data. A substrate on which a poly-Si film is formed, and the film thickness of the poly-Si film is already known, may be used to make actual absorptivity measurements by using a spectrophotometer, for example, in order to investigate the dependence of the absorptivity of 532 nm light on the poly-Si film thickness. Alternatively, the film thickness of the poly-Si film and its index of refraction may be measured by using an ellipsometer, and the light absorptivity A(t) may be simulated. The latter method does not entail much trouble, and is useful in understanding how the light absorptivity continuously depends on the film thickness.

The film thickness distribution of the poly-Si film within the surface of the substrate becomes ±5%, similar to the variations in film thickness of the a-Si film within the surface of the substrate discussed in the Embodiment Mode. It can thus be seen that there will be variations in film thickness within the substrate surface of a maximum film thickness equal to 1.05 t, and a minimum film thickness equal to 0.95 t, if the target film thickness for poly-Si film formation is taken as t.

Figure 4A:
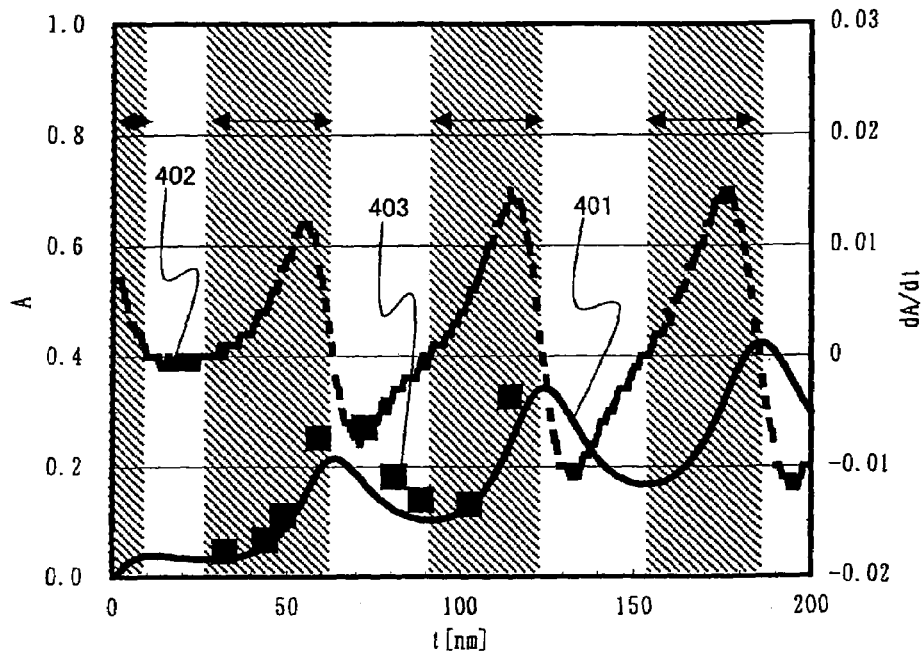
FIGS. 4A and 4B show: an absorptivity, A(t), of light (532 nm) in a poly-Si film found by computer simulation performed based on an index of refractive index (n) and an extinction constant (k), obtained from an ellipsometer; a derivative dA(t)/dt of the light absorptivity A(t); and actual measured values of the absorptivity of light having a wavelength of 532 nm when the poly-Si film thickness is changed.
Figure 4B:
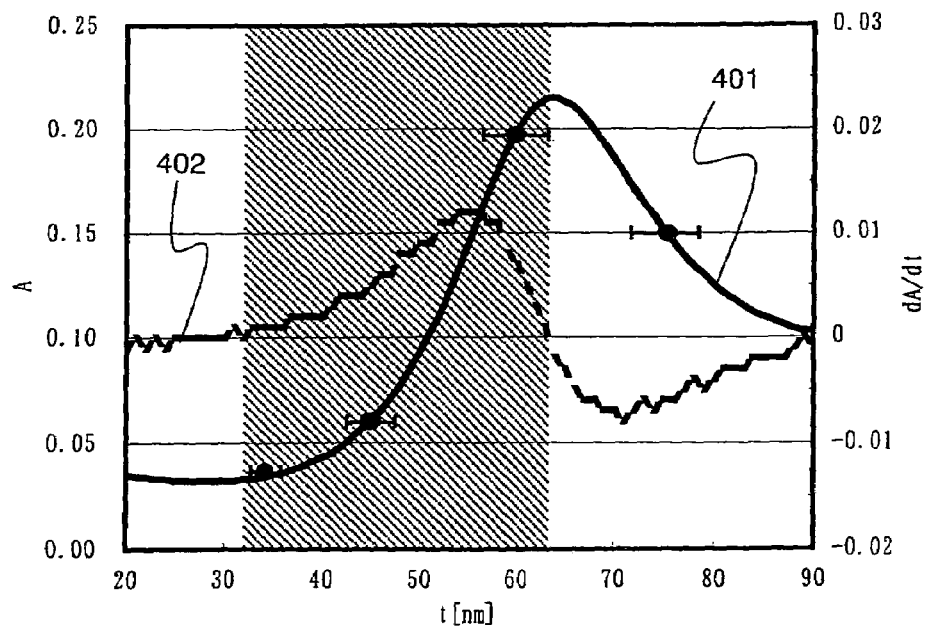

Refer to FIGS. 4A and 4B. In FIG. 4A, reference numeral 401 denotes a light absorptivity A(t) at 532 nm found by a computer simulation performed based on an index of refractive index (n) and an extinction constant (k) obtained from an ellipsometer. Reference numeral 402 denotes a derivative dA(t)/dt of the light absorptivity A(t), and reference numeral 403 denotes actual measured values of light absorptivity at 532 nm when varying the poly-Si film thickness. Note that, for convenience of computation, the difference between the variations in the light absorptivity with respect to the film thickness may be found as a substitute for the derivative of the light absorptivity A(t).

By comparing the actual measured values 403 with the simulation 401, it can be seen that, although there is a small difference with the light absorptivity itself, the values of the poly-Si film thickness at which light absorptivity at 532 nm takes the maximum value and the minimum value have relatively good agreement. However, the values found here do not agree with the values of the a-Si film thickness, discussed in Embodiment 1, at which light absorptivity at 532 nm takes the maximum and minimum values.

If the derivative dA(t)/dt of the light absorptivity is found from the simulation results of the light absorptivity at 532 nm by the a-Si film, and poly-Si film thickness ranges in which dA(t)/dt>0 are selected, then a range from 1 nm to 9 nm, a range from 33 nm to 63 nm, a range from 91 nm to 123 nm, a range from 155 nm to 185 nm, and the like are found. Variations in the degree of crystallization due to film thickness variations can be reduced in a self-alignment manner, provided that the film thickness of the poly-Si film is within these ranges. This can be clearly understood by referring to FIG. 4B in which the graph of a 20 nm to 90 nm region of FIG. 4A is blown up.

The poly-Si film formed on the glass substrate at a target film thickness of t possesses film thickness variations within the substrate surface, with the maximum film thickness equal to 1.05 t and the minimum film thickness equal to 0.95 t. Therefore the film thickness t may be selected so that dA(t)/dt>0 is always achieved, even if the film thickness fluctuates from 0.95 t to 1.05 t, in order to reduce variations in the degree of crystallization, due to film thickness variations over the entire substrate surface, in a self-alignment manner.

It can thus be seen from the above method that the target film thickness of a poly-Si film capable of reducing variations in the degree of crystallization, due to dispersions in the film thickness over the entire substrate surface in a self-alignment manner, is from 1.1 nm to 8.6 nm, from 31.4 nm to 60.0 nm, from 95.8 nm to 117.1 nm, from 163.2 nm to 176.2 nm, and the like. Variations in the degree of crystallization caused by dispersions in the film thickness within the substrate surface can be reduced provided that laser crystallization of the entire substrate surface is performed by using the second harmonic (532 nm) of a CW Nd:YVO$_4$ laser with the film thickness of the poly-Si film set to one of the above ranges for the laser irradiation process.

Once the set film thickness of the poly-Si film is determined, the poly-Si film may then be formed at the determined film thickness on the glass substrate if laser crystallization of the poly-Si film substrate is to be performed by using the second harmonic (532 nm) of a CW Nd:YVO$_4$ laser.

For cases in which crystallization over the entire substrate surface is not necessary, and for cases in which it is not necessary to reduce variations in the degree of crystallization over the entire substrate surface, the range of the poly-Si film to which the film thickness is measured may also be limited to portions of the substrate where it is desired to reduce variations in the degree of crystallization.

Variations in the degree of crystallization during laser crystallization can be reduced by the laser beam irradiation method of the present invention, even for cases in which there are film thickness variations within the surface of a non-single crystal semiconductor.

What is claimed is:

1. A laser beam irradiation method comprising:
    obtaining data showing a dependence of a light absorptivity upon a film thickness of a semiconductor film at a certain wavelength of a laser beam;
    forming a semiconductor film having a film thickness distribution over a substrate; and
    irradiating the semiconductor film with a laser beam to crystallize the semiconductor film,
    wherein a differential coefficient of an absorptivity of the laser beam with respect to a film thickness of the semiconductor film is positive.

2. A laser beam irradiation method according to claim 1, wherein the laser beam is a pulse oscillation laser beam.

3. A laser beam irradiation method according to claim 2, wherein the pulse oscillation laser beam comprises a high harmonic of a solid pulse laser.

4. A laser beam irradiation method according to claim 3, wherein the laser beam comprising the high harmonic of the solid pulse laser is one selected from the group consisting of an Nd:YAG laser beam, an Nd:YVO$_4$ laser beam, and an Nd:YLF laser beam.

5. A laser beam irradiation method according to claim 1, wherein the laser beam is a continuous wave laser beam.

6. A laser beam irradiation method according to claim 5, wherein the continuous wave laser beam is an Ar laser beam.

7. A laser beam irradiation method according to claim 5, wherein the continuous wave laser beam comprises a high harmonic of a solid continuous wave laser.

8. A laser beam irradiation method according to claim 7, wherein the laser beam comprising the high harmonic of the solid continuous wave laser is one selected from the group consisting of an Nd:YAG laser and an Nd:YVO$_4$ laser.

9. A laser beam irradiation method according to claim 1, wherein the certain wavelength of the laser beam is 532 nm.

10. A laser beam irradiation method according to claim 1, wherein the data are obtained by a computer simulation.

11. A laser beam irradiation method comprising:
obtaining data showing a dependence of a light absorptivity upon a film thickness of a first semiconductor film at a certain wavelength of a laser beam;
after obtaining the data forming a second semiconductor film having a film thickness distribution over a substrate; and
irradiating the second semiconductor film with a laser beam to crystallize the second semiconductor film,
wherein the film thickness of the second semiconductor film is determined by a refractive index of the first semiconductor film at the certain wavelength of the laser beam.

12. A laser beam irradiation method according to claim 11, wherein the laser beam is a pulse oscillation laser beam.

13. A laser beam irradiation method according to claim 12, wherein the pulse oscillation laser beam comprises a high harmonic of a solid pulse laser.

14. A laser beam irradiation method according to claim 13, wherein the laser beam comprising the high harmonic of the solid pulse laser is one selected from the group consisting of an Nd:YAG laser beam, an Nd:YVO$_4$ laser beam, and an Nd:YLF laser beam.

15. A laser beam irradiation method according to claim 11, wherein the laser beam is a continuous wave laser beam.

16. A laser beam irradiation method according to claim 15, wherein the continuous wave laser beam is an Ar laser beam.

17. A laser beam irradiation method according to claim 15, wherein the continuous wave laser beam comprises a high harmonic of a solid continuous wave laser.

18. A laser beam irradiation method according to claim 17, wherein the laser beam comprising the high harmonic of the solid continuous wave laser is one selected from the group consisting of an Nd:YAG laser and an Nd:YVO$_4$ laser.

19. A laser irradiation method according to claim 11, wherein the certain wavelength of the laser beam is 532 nm.

20. A laser beam irradiation method according to claim 11, wherein the data are obtained by a computer simulation.

21. A method of manufacturing a thin film transistor comprising:
obtaining data showing a dependence of a light absorptivity upon a film thickness of a semiconductor film at a certain wavelength of a laser beam;
forming a semiconductor film having a film thickness distribution over a substrate; and
irradiating the semiconductor film with a laser beam to crystallize the semiconductor film,
wherein a differential coefficient of an absorptivity of the laser beam with respect to a film thickness of the semiconductor film is positive.

22. A method of manufacturing a thin film transistor according to claim 21, wherein the laser beam is a pulse oscillation laser beam.

23. A method of manufacturing a thin film transistor according to claim 22, wherein the pulse oscillation laser beam comprises a high harmonic of a solid pulse laser.

24. A method of manufacturing a thin film transistor according to claim 23, wherein the laser beam comprising the high harmonic of the solid pulse laser is one selected from the group consisting of an Nd:YAG laser beam, an Nd:YVO$_4$ laser beam, and an Nd:YLF laser beam.

25. A method of manufacturing a thin film transistor according to claim 21, wherein the laser beam is a continuous wave laser beam.

26. A method of manufacturing a thin film transistor according to claim 25, wherein the continuous wave laser beam is an Ar laser beam.

27. A method of manufacturing a thin film transistor according to claim 25, wherein the continuous wave laser beam comprises a high harmonic of a solid continuous wave laser.

28. A method of manufacturing a thin film transistor according to claim 27, wherein the laser beam comprising the high harmonic of the solid continuous wave laser is one selected from the group consisting of an Nd:YAG laser and an Nd:YVO$_4$ laser.

29. A method of manufacturing a thin film transistor according to claim 21, wherein the certain wavelength of the laser beam is 532 nm.

30. A method of manufacturing a thin film transistor according to claim 21, wherein the data are obtained by a computer simulation.

31. A method of manufacturing a thin film transistor comprising:
obtaining data showing a dependence of a light absorptivity upon a film thickness of a first semiconductor film at a certain wavelength of a laser beam;
after obtaining the data forming a second semiconductor film having a film thickness distribution over a substrate; and
irradiating the second semiconductor film with a laser beam to crystallize the second semiconductor film,
wherein the film thickness of the second semiconductor film is determined by a refractive index of the first semiconductor film at the certain wavelength of the laser beam.

32. A method of manufacturing a thin film transistor according to claim 31, wherein the laser beam is a pulse oscillation laser beam.

33. A method of manufacturing a thin film transistor according to claim 32, wherein the pulse oscillation laser beam comprises a high harmonic of a solid pulse laser.

34. A method of manufacturing a thin film transistor according to claim 33, wherein the laser beam comprising the high harmonic of the solid pulse laser is one selected from the group consisting of an Nd:YAG laser beam, an Nd:YVO$_4$ laser beam, and an Nd:YLF laser beam.

35. A method of manufacturing a thin film transistor according to claim 31, wherein the laser beam is a continuous wave laser beam.

36. A method of manufacturing a thin film transistor according to claim 35, wherein the continuous wave laser beam is an Ar laser beam.

37. A method of manufacturing a thin film transistor according to claim 35, wherein the continuous wave laser beam comprises a high harmonic of a solid continuous wave laser.

38. A method of manufacturing a thin film transistor according to claim 37, wherein the laser beam comprising the high harmonic of the solid continuous wave laser is one selected from the group consisting of an Nd:YAG laser and an Nd:YVO$_4$ laser.

39. A method of manufacturing a thin film transistor according to claim 31, wherein the certain wavelength of the laser beam is 532 nm.

40. A method of manufacturing a thin film transistor according to claim 31, wherein the data are obtained by a computer simulation.

41. A method of manufacturing a semiconductor device having a pixel portion and a driving circuit comprising the steps of:
obtaining data showing a dependence of a light absorptivity upon a film thickness of a semiconductor film at a certain wavelength of a laser beam;
forming a semiconductor film having a film thickness distribution over a substrate; and
irradiating the semiconductor film with a laser beam to crystallize the semiconductor film,
wherein a differential coefficient of an absorptivity of the laser beam with respect to a film thickness of the semiconductor film is positive.

42. A method of manufacturing a semiconductor device according to claim 41, wherein the semiconductor device is an active matrix type display device.

43. A method of manufacturing a semiconductor device according to claim 41, wherein the laser beam is a pulse oscillation laser beam.

44. A method of manufacturing a semiconductor device according to claim 41, wherein the pulse oscillation laser beam comprises a high harmonic of a solid pulse laser.

45. A method of manufacturing a semiconductor device according to claim 41, wherein the laser beam comprising the high harmonic of the solid pulse laser is one selected from the group consisting of an Nd:YAG laser beam, an Nd:YVO$_4$ laser beam, and an Nd:YLF laser beam.

46. A method of manufacturing a semiconductor device according to claim 41, wherein the laser beam is a continuous wave laser beam.

47. A method of manufacturing a semiconductor device according to claim 41, wherein the continuous wave laser beam is an Ar laser beam.

48. A method of manufacturing a semiconductor device according to claim 41, wherein the continuous wave laser beam comprises a high harmonic of a solid continuous wave laser.

49. A method of manufacturing a semiconductor device according to claim 41, wherein the laser beam comprising the high harmonic of the solid continuous wave laser is one selected from the group consisting of an Nd:YAG laser and an Nd:YVO$_4$ laser.

50. A method of manufacturing a semiconductor device according to claim 41, wherein a wavelength of the laser beam is greater than 350 nm.

51. A method of manufacturing a semiconductor device according to claim 41, wherein the certain wavelength of the laser beam is 532 nm.

52. A method of manufacturing a semiconductor device according to claim 41, wherein the data are obtained by a computer simulation.

53. A method of manufacturing a semiconductor device having a pixel portion and driving circuit comprising the steps of:
obtaining data showing a dependence of a light absorptivity upon a film thickness of a first semiconductor film at a certain wavelength of a laser beam;
after obtaining the data forming a second semiconductor film having a film thickness distribution over a substrate; and
irradiating the second semiconductor film with a laser beam to crystallize the second semiconductor film,
wherein the film thickness of the second semiconductor film is determined by a refractive index of the first semiconductor film at the certain wavelength of the laser beam.

54. A method of manufacturing a semiconductor device according to claim 53, wherein the semiconductor device is an active matrix type liquid crystal display device.

55. A method of manufacturing a semiconductor device according to claim 53, wherein the laser beam is a pulse oscillation laser beam.

56. A method of manufacturing a semiconductor device according to claim 53, wherein the pulse oscillation laser beam comprises a high harmonic of a solid pulse laser.

57. A method of manufacturing a semiconductor device according to claim 53, wherein the laser beam comprising the high harmonic of the solid pulse laser is one selected from the group consisting of an Nd:YAG laser beam, an Nd:YVO$_4$ laser beam, and an Nd:YLF laser beam.

58. A method of manufacturing a semiconductor device according to claim 53, wherein the laser beam is a continuous wave laser beam.

59. A method of manufacturing a semiconductor device according to claim 53, wherein the continuous wave laser beam is an Ar laser beam.

60. A method of manufacturing a semiconductor device according to claim 53, wherein the continuous wave laser beam comprises a high harmonic of a solid continuous wave laser.

61. A method of manufacturing a semiconductor device according to claim 53, wherein the laser beam comprising the high harmonic of the solid continuous wave laser is one selected from the group consisting of an Nd:YAG laser and an Nd:YVO$_4$ laser.

62. A method of manufacturing a semiconductor device according to claim 53, wherein the certain wavelength of the laser beam is 532 nm.

63. A method of manufacturing a semiconductor device according to claim 53, wherein the data are obtained by a computer simulation.

64. A method of manufacturing a semiconductor device according to claim 53, wherein a wavelength of the laser beam is greater than 350 nm.

* * * * *